(12) United States Patent
Kim et al.

(10) Patent No.: US 11,570,915 B2
(45) Date of Patent: Jan. 31, 2023

(54) DISPLAY DEVICE

(71) Applicant: Samsung Display Co., Ltd., Yongin-Si (KR)

(72) Inventors: Jeongho Kim, Seoul (KR); Hyungsik Kim, Suwon-si (KR); Dongwon Choi, Seoul (KR); Jin Hwan Choi, Seoul (KR); Hayk Khachatryan, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 82 days.

(21) Appl. No.: 17/116,078

(22) Filed: Dec. 9, 2020

(65) Prior Publication Data

US 2021/0274666 A1 Sep. 2, 2021

(30) Foreign Application Priority Data

Mar. 2, 2020 (KR) .................. 10-2020-0026192

(51) Int. Cl.
*H05K 7/02* (2006.01)
*H05K 7/04* (2006.01)
*H05K 5/02* (2006.01)
*H05K 5/00* (2006.01)
*H01L 51/52* (2006.01)

(52) U.S. Cl.
CPC ......... *H05K 5/0217* (2013.01); *H05K 5/0017* (2013.01); *H01L 51/5253* (2013.01); *H01L 2251/5338* (2013.01)

(58) Field of Classification Search
CPC combination set(s) only.
See application file for complete search history.

(56) References Cited

U.S. PATENT DOCUMENTS

| 10,194,543 | B2 | 1/2019 | Seo et al. | |
|---|---|---|---|---|
| 2016/0100478 | A1* | 4/2016 | Lee | G06F 1/1652 361/749 |
| 2016/0161983 | A1 | 6/2016 | Lee et al. | |
| 2018/0077808 | A1* | 3/2018 | Seo | G06F 3/044 |
| 2018/0110137 | A1* | 4/2018 | Kim | G02F 1/133305 |
| 2019/0204874 | A1 | 7/2019 | Kim et al. | |
| 2020/0020255 | A1* | 1/2020 | Yoon | G02F 1/133305 |
| 2020/0060028 | A1 | 2/2020 | Kim et al. | |
| 2020/0337161 | A1* | 10/2020 | Choi | B32B 27/308 |

FOREIGN PATENT DOCUMENTS

| CN | 110010002 A | 7/2019 |
|---|---|---|
| EP | 2557556 A2 | 2/2013 |
| KR | 1020180040181 A | 4/2018 |
| KR | 1020190083687 A | 7/2019 |

* cited by examiner

*Primary Examiner* — Hung S. Bui
(74) *Attorney, Agent, or Firm* — Cantor Colburn LLP

(57) ABSTRACT

A display device includes a display module extending in a first direction, a supporting portion disposed under the display module and which supports a part of the display module, a first driving part connected to a first end of the display module to roll and unroll the display module, a connecting portion connected to a second end of the display module, and a second driving part connected to the connecting portion to roll and unroll the connecting portion. The second driving part unrolls the connecting portion when the first driving part rolls the display module, and the second driving part rolls the connecting portion when the first driving part unrolls the display module.

20 Claims, 16 Drawing Sheets

DISPLAY DEVICE

This application claims priority to Korean Patent Application No. 10-2020-0026192, filed on Mar. 2, 2020, and all the benefits accruing therefrom under 35 U.S.C. § 119, the content of which in its entirety is herein incorporated by reference.

BACKGROUND

The present disclosure herein relates to a display device, and more particularly, to a display device in which a display module is expanded or reduced.

In general, an electronic apparatus providing images to users, such as smartphones, digital cameras, laptop computers, navigation devices, and smart televisions, includes a display device for displaying images. The display device generates images to provide the images to users through a display screen.

Various types of display devices have been developed. For example, a flexible display device or the like that may be folded or rolled has been developed. The flexible display device capable of being deformed into various shapes may be easily portable and may improve the convenience of users.

SUMMARY

The flexible display device may provide a display screen of various sizes to the user. For example, the flexible display device may operate in a basic mode and an extended mode. In the basic mode, a part of a flexible display module is exposed, and the other part may be disposed inside a case in a rolled state. The other part that is rolled may be unrolled and unfolded in the expanded mode.

The present disclosure provides a display device capable of preventing damage to a display module when the display module is rolled and unrolled.

An embodiment of the inventive concept provides a display device including a display module extending in a first direction, a supporting portion disposed under the display module and which supports a part of the display module, a first driving part connected to a first end of the display module to roll and unroll the display module, a connecting portion connected to a second end of the display module, and a second driving part connected to the connecting portion to roll and unroll the connecting portion. The second driving part unrolls the connecting portion when the first driving part rolls the display module, and the second driving part rolls the connecting portion when the first driving part unrolls the display module.

An embodiment of the inventive concept provides a display device including a display module, a supporting portion disposed under the display module and which supports a part of the display module, a first driving part connected to a first end of the display module to roll and unroll the display module, and a second driving part connected to a second end of the display module to roll and unroll the display module. The second driving part unrolls the display module when the first driving part rolls the display module, and the first driving part unrolls the display module when the second driving part rolls the display module.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
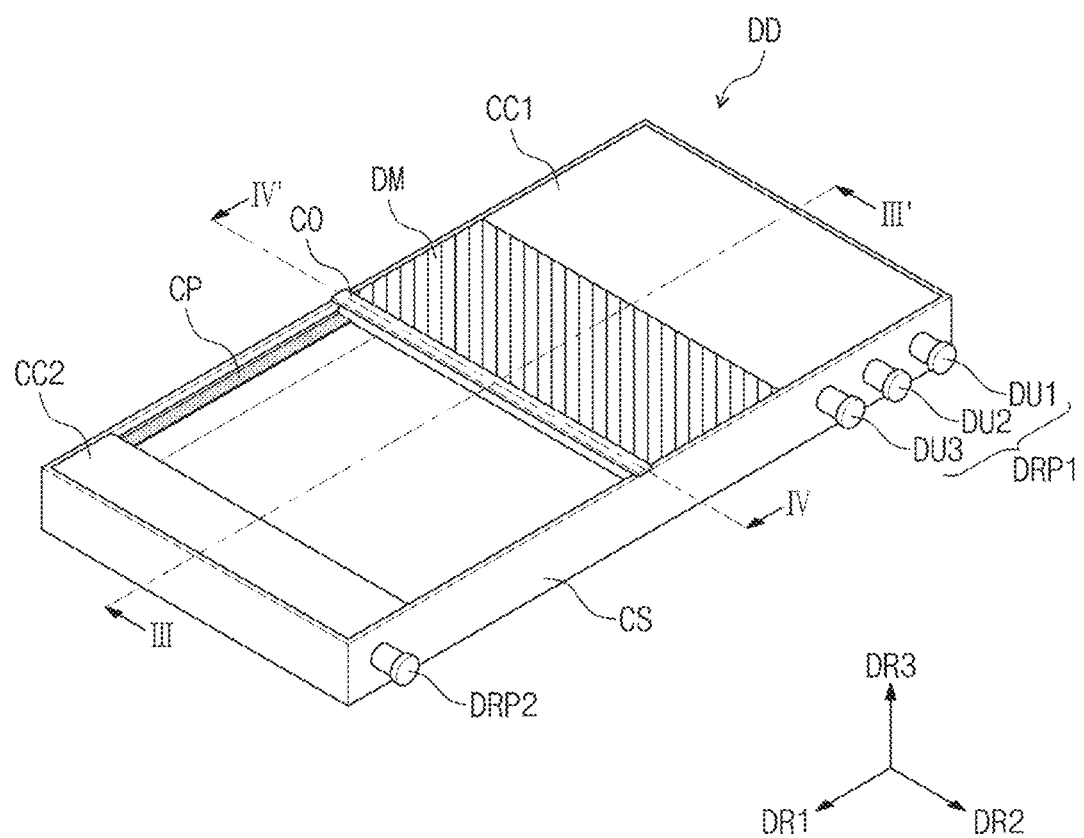
FIGS. 1 to 3 are perspective views of a display device according to an embodiment of the inventive concept.

In the present specification, it will be understood that when an element (or region, layer, part, or the like) is referred to as being "on", "connected to" or "coupled to" another element, it can be directly on, connected or coupled to the other element or intervening elements may be present.

Like numbers refer to like elements throughout. In the drawings, the thicknesses, the ratios and the dimensions of the elements are exaggerated for effective description of the technical contents.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, without departing from the teachings of the present invention, a first element could be termed a second element, and similarly, a second element could be termed a first element. The singular forms, "a", "an" and "the" are intended to include the plural forms as well, unless the context clearly indicates otherwise.

Terms, such as "beneath", "below", "lower", "above", "upper" and the like, may be used herein for ease of description to describe one element or feature's relationship to another element(s) or feature(s) as illustrated in the figures. It will be understood that the terms are spatially relative terms and are to be described with reference to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the inventive concept will be described with reference to the drawings.

Figure 2:
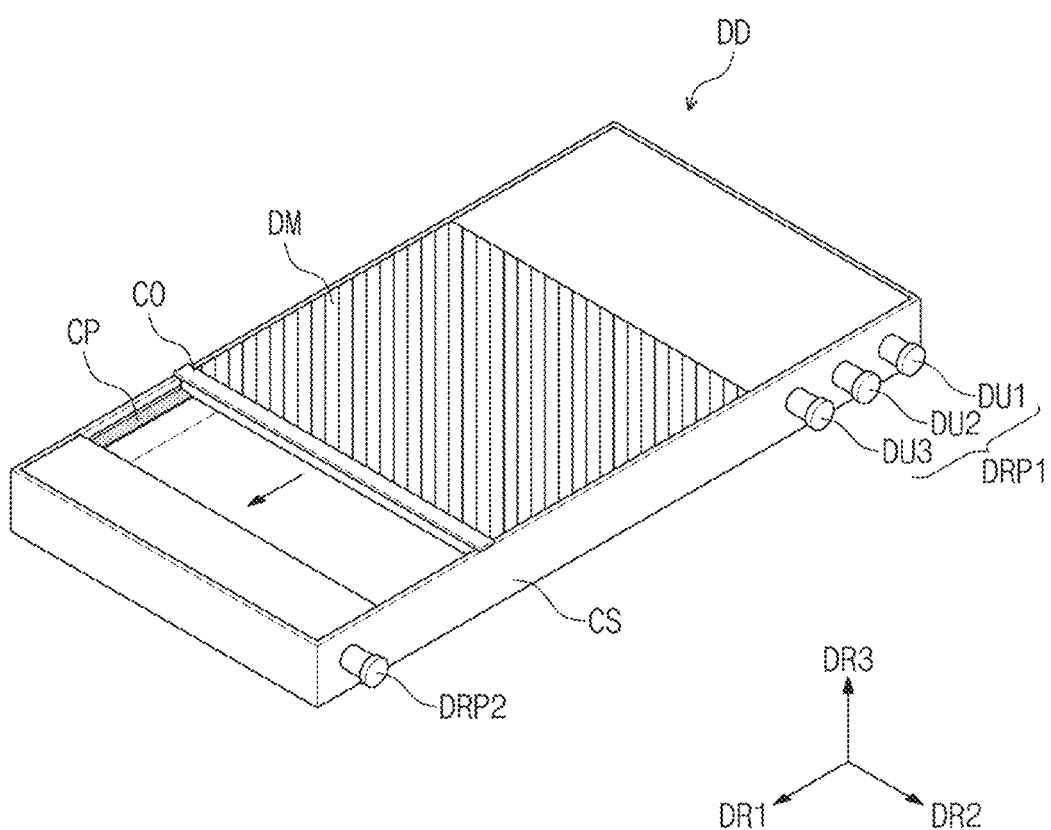
Figure 3:
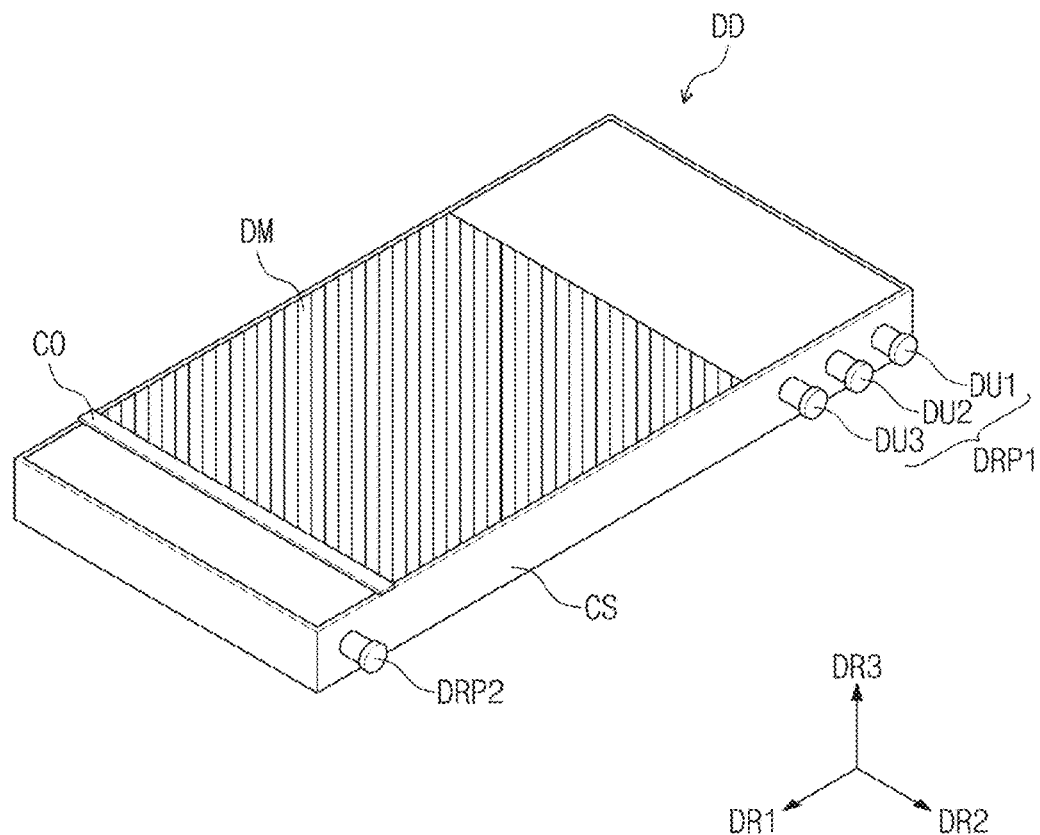

FIGS. 1 to 3 are perspective views of a display device according to an embodiment of the inventive concept.

A display device DD illustrated in FIG. 1 represents a mode before the exposed region of a display module DM starts to expand (hereinafter referred to as a first mode). FIG. 2 illustrates a state in which the exposed region of the display module DM of the display device DD is expanding. The display device DD illustrated in FIG. 3 represents a mode in which the exposed region of the display module DM is fully expanded (hereinafter referred to as a second mode).

Referring to FIG. 1, the display device DD according to an embodiment of the inventive concept may operate in the first mode or the second mode as the exposed region of the display module DM is reduced or expanded. The display device DD may include a case CS, the display module DM, a supporting portion (not illustrated), a first driving part DRP1, a fastening portion CO, a connecting portion CP, and a second driving part DRP2.

The case CS may have a square frame shape. The display module DM may be disposed in the case CS. The display module DM has a plane defined by a first direction DR1 and a second direction DR2 crossing the first direction DR1. The exposed region of the display module DM may be exposed outside the case CS, and the rest may not be exposed outside by a first cover CC1 of the case CS.

When viewed in a plan view, the display module DM may have a rectangular shape. "When viewed in a plan view" means "when viewed in a third direction DR3 perpendicular to the plane defined by the first direction DR1 and the second direction DR2".

Although not illustrated, the supporting portion may be disposed under the display module DM. The supporting portion may support a part of the display module DM. The detailed structure of the supporting portion will be described later.

One end (i.e., an end, which is near the first driving part DRP1, of two ends in the first direction DR1, for example, a first end) of the display module DM may be connected to the first driving part DRP1. The first driving part DRP1 may be disposed inside the case CS. When viewed in a plan view, the first driving part DRP1 may not be visible to the outside due to the first cover CC1. The first driving part DRP1 may roll and unroll the display module DM.

The other end (i.e., an end, which is near the second driving part DRP2, of two ends in the first direction DR1, for example, a second end) of the display module DM may be connected to the connecting portion CP. The other end of the display module DM may be connected to the connecting portion CP by the fastening portion CO.

The connecting portion CP may be connected to the second driving part DRP2. The second driving part DRP2 may be disposed inside the case CS. When viewed in a plan view, the second driving part DRP2 may not be visible to the outside due to a second cover CC2. The second driving part DRP2 may roll and unroll the connecting portion CP.

Referring to FIG. 2, the display module DM may be switched from the first mode to the second mode by the first driving part DRP1 and the second driving part DRP2. For example, when the first driving part DRP1 unrolls the display module DM, the second driving part DRP2 may roll the connecting portion CP. Accordingly, the other end (e.g., second end) of the display module DM may move to be closer to the second driving part DRP2. When the other end of the display module DM moves toward the second driving part DRP2, the exposed region of the display module DM may be expanded.

Referring to FIG. 3, when the fastening portion CO reaches a predetermined position, the display module DM may no longer move. The predetermined position may mean a position of the fastening portion CO when the fastening portion CO contacts the second cover CC2 of the case CS. Accordingly, the display device DD may be switched from the first mode to the second mode.

The display module DM may be switched from the second mode to the first mode by the first driving part DRP1 and the second driving part DRP2. For example, when the first driving part DRP1 rolls the display module DM, the second driving part DRP2 may unroll the connecting portion CP. Accordingly, the other end of the display module DM may move away from the second driving part DRP2. When the other end of the display module DM moves away from the second driving part DRP2, the exposed region of the display module DM may be reduced. Accordingly, the display device DD may be switched from the second mode to the first mode.

As described above, the display device DD may expand or reduce the exposed region of the display module DM by the first driving part DRP1 and the second driving part DRP2. An image may be implemented in the exposed region of the display module DM. That is, the display device DD according to an embodiment of the inventive concept may provide a wide display screen to the user through the second mode in which the display module DM is expanded.

Hereinafter, each configuration of the display device DD will be described in more detail.

Figure 4:
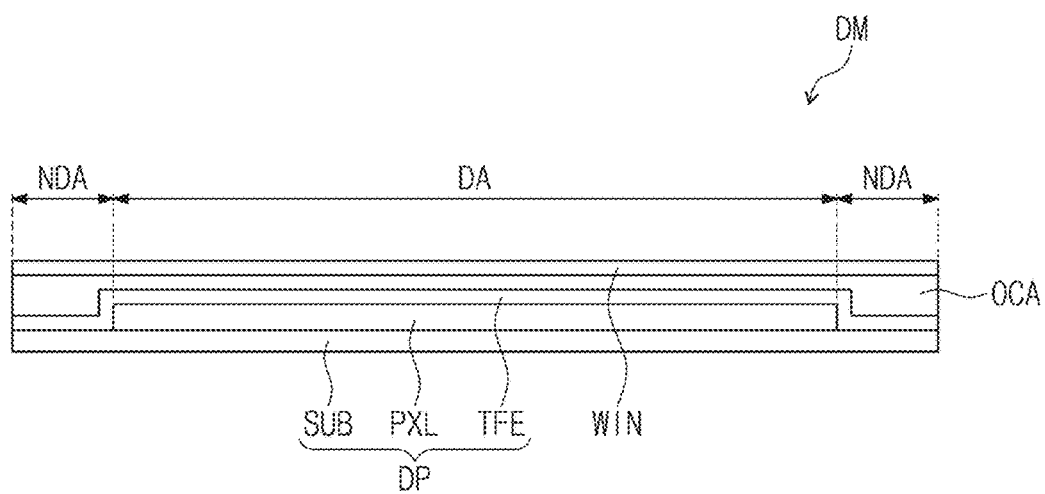
FIG. 4 is a diagram schematically illustrating a cross section of a display module illustrated in FIG. 1.

FIG. 4 is a diagram schematically illustrating a cross section of a display module illustrated in FIG. 1;

Referring to FIG. 4, the display module DM may include a display panel DP and a window WIN disposed over the display panel DP.

The display panel DP may be a light emitting display panel. For example, the display panel DP may be an organic light emitting display panel or a quantum dot light emitting display panel. The light emitting layer of the organic light emitting display panel may contain an organic light emitting material. The light emitting layer of the quantum dot light emitting display panel may include a quantum dot, a quantum rod, and the like. However, the type of the display panel DP of the inventive concept is not limited thereto. The display panel DP may be a liquid crystal display panel in another embodiment.

For convenience of description, the display panel DP is hereinafter described as an organic light emitting display panel.

The display panel DP may be a flexible panel. For example, the display panel DP may be rolled or unrolled by rotation of the first driving part DRP1 (see FIG. 1).

The display panel DP may include a substrate SUB, a pixel layer PXL disposed on the substrate SUB, and a thin film encapsulation layer TFE disposed on the substrate SUB to cover the pixel layer PXL.

A display region DA may display an image. The area of the display region DA may be adjusted by the first and second driving parts DRP1 and DRP2 described above. A non-display region NDA may define a border of the display module DM and may not display an image.

The pixel layer PXL may be disposed on the substrate SUB. The pixel layer PXL may include a plurality of pixels, and each of the pixels may include a light emitting device.

The thin film encapsulation layer TFE may include at least two inorganic layers and an organic layer disposed between the inorganic layers. The inorganic layers may contain an inorganic material and protect the pixel layer PXL from moisture/oxygen. The organic layer may contain an organic material and protect the pixel layer PXL from foreign materials such as dust particles.

The window WIN may protect the display panel DP from external scratches and impacts. The window WIN may be a flexible window. For example, the window WIN may be rolled or unrolled by rotation of the first driving part DRP1.

The window WIN may be attached to the display panel DP by an adhesive OCA. For example, the adhesive OCA may include an optical clear adhesive. The image generated on the display panel DP may be provided to the user through the window WIN.

The structure of the display module DM of the inventive concept is not limited thereto. For example, the display module DM may further include an input sensing portion disposed between the window WIN and the display panel DP in another embodiment. For example, the input sensing portion may detect an external input (for example, a touch of the user), change it to a predetermined input signal, and provide the input signal to the display panel DP. The input sensing portion may include a plurality of sensing electrodes for sensing external inputs. The sensing electrodes may sense external inputs in a capacitive manner. The display panel DP may receive the input signal from the input sensing portion and generate an image corresponding to the input signal.

Figure 5:
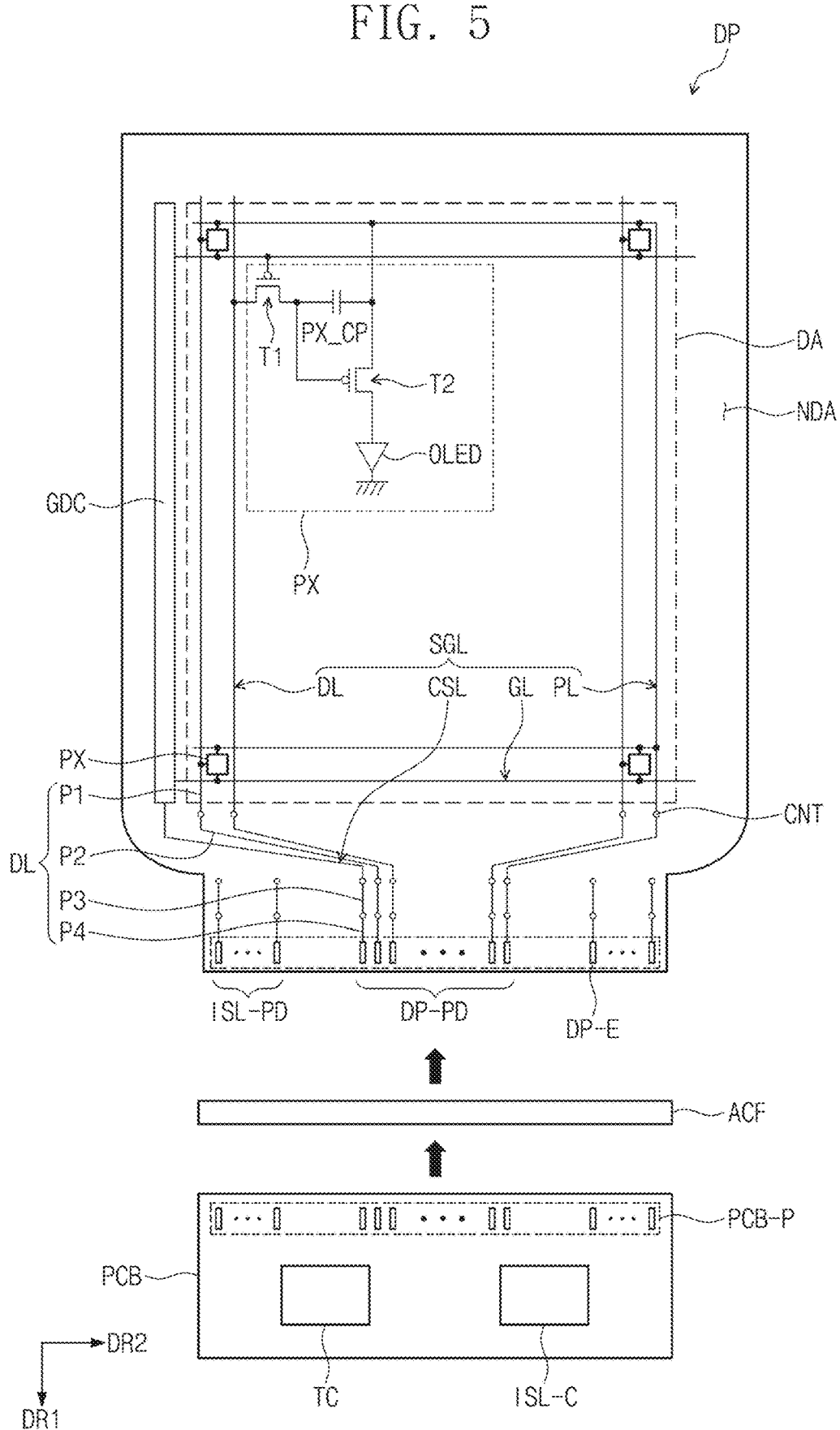
FIG. 5 is a plan view of a display panel illustrated in FIG. 4.

FIG. 5 is a plan view of a display panel illustrated in FIG. 4;

Referring to FIG. 5, the display panel DP may include a driving circuit GDC, a plurality of signal lines SGL, a plurality of signal pads DP-PD, and a plurality of pixels PX.

The driving circuit GDC may include a scan driving circuit. The scan driving circuit generates a plurality of scan signals and sequentially outputs the scan signals to a plurality of scan lines GL to be described later. The scan driving circuit may further output another control signal to the driving circuit of the pixels PX.

The scan driving circuit may include a plurality of transistors formed through the same process as the driving circuit of the pixels PX, for example, a low temperature polycrystalline silicon ("LTPS") process or a low temperature polycrystalline oxide ("LTPO") process.

The signal lines SGL include scan lines GL, data lines DL, a power line PL, and a control signal line CSL. Each of the scan lines GL is connected to a corresponding pixel PX of the pixels PX, and each of the data lines DL is connected to a corresponding pixel PX of the pixels PX. The power line PL is connected to the pixels PX. The control signal line CSL may provide control signals to the scan driving circuit.

The signal lines SGL may include a plurality of parts disposed on different layers. In FIG. 5, the data lines DL including four parts P1 to P4 are illustrated by way of example. The four parts P1 to P4 may be connected to each other through a contact hole CNT.

The signal pads DP-PD may include signal pads DP-PD connected to the data lines DL, the power line PL, and the control signal line CSL. The signal pads DP-PD are disposed adjacent to each other in a pad region DP-E defined in some regions of the non-display region NDA. The stacked structure or constituent materials of the signal pads DP-PD are not distinguished from each other, and may be provided through the same process.

The display region DA may be defined as a region in which the pixels PX are disposed. A plurality of electronic elements is disposed in the display region DA. The electronic elements include an organic light emitting diode provided in each of the pixels PX and a pixel driving circuit connected thereto.

The pixel PX may include, for example, a first transistor T1, a second transistor T2, a capacitor PX_CP, and an organic light emitting diode OLED. The pixel driving circuit is sufficient to include a switching transistor and a driving transistor, but is not limited thereto. The first transistor T1 is connected to the scan line GL and the data line DL. The organic light emitting diode receives a power voltage provided by the power line PL.

FIG. 5 additionally illustrates a circuit board PCB electrically connected to the display panel DP. The circuit board PCB may be a rigid circuit board or a flexible circuit board.

A timing control circuit TC for controlling the operation of the display panel DP may be disposed on the circuit board PCB. In addition, an input sensing circuit ("ISL-C") for controlling the input sensor may be disposed on the circuit board PCB. Each of the timing control circuit TC and the input sensing circuit ISL-C may be mounted on the circuit board PCB in the form of an integrated chip. In an embodiment of the inventive concept, the timing control circuit TC and the input sensing circuit ISL-C may be mounted on the circuit board PCB in the form of one integrated chip. The circuit board PCB may include circuit board pads PCB-P electrically connected to the signal pads DP-PD. Although not illustrated, the circuit board PCB further includes signal lines connecting the circuit board pads PCB-P and the timing control circuit TC and/or the input sensing circuit ISL-C. In addition, the circuit board pads PCB-P may be output pads, and the circuit board PCB may further include an input pad.

The signal pads DP-PD of the display panel DP and the circuit board pads PCB-P may be electrically connected through a conductive member such as an anisotropic conductive film ACF. In an embodiment of the inventive concept, the anisotropic conductive film ACF may be replaced with a conductive ball or the like.

A portion of the display panel DP illustrated in FIG. 5 may be banded. For example, a portion of the non-display region NDA may be banded in a band axis parallel to the second direction DR2. The band axis may be defined to be overlapped with third portions P3 of the data lines DL.

Figure 6:
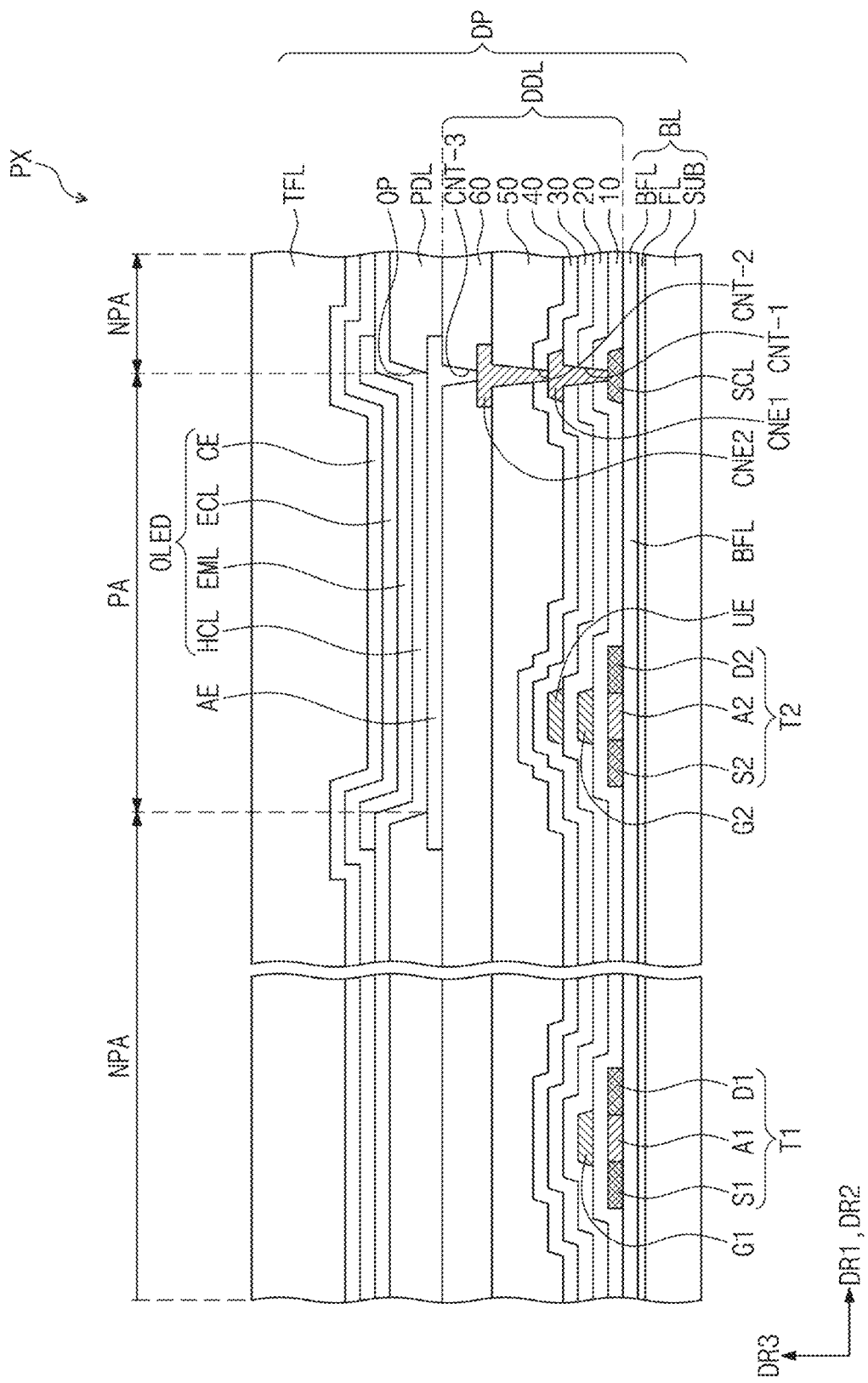
FIG. 6 is a diagram schematically illustrating a cross section of a pixel illustrated in FIG. 5.

FIG. 6 is a diagram schematically illustrating a cross section of a pixel illustrated in FIG. 5.

Referring to FIG. 6, the display panel DP may include the substrate SUB, a device layer DDL, a pixel defining layer PDL, a plurality of light emitting devices OLED, and the thin film encapsulation layer TFE.

A base layer BL may include the substrate SUB, a barrier layer FL, and a buffer layer BFL. The substrate SUB may include a plurality of pixel regions PA and non-pixel regions NPA around the pixel regions. Although only one pixel region PA is illustrated in FIG. 6, in practice, a plurality of pixel regions PA may be defined on the substrate SUB. The non-pixel region NPA may be disposed to surround each of the pixel region PA.

The substrate SUB is a transparent substrate, and may include a flexible plastic substrate. For example, the substrate SUB may include polyimide ("PI"). The barrier layer FL may cover an upper surface of the substrate SUB. The buffer layer BFL may be lower side of the device layer DDL. Each of the barrier layer FL and the buffer layer BFL may include inorganic layer or both of inorganic layer and organic layer. Each of the barrier layer FL and the buffer layer BFL may be stacked layers, but is not limited thereto.

The device layer DDL may include the first transistor T1, the second transistor T2, a first insulating layer 10, a second insulating layer 20, a third insulating layer 30, and a fourth insulating layer 40, a fifth insulating layer 50, and a sixth insulating layer 60.

A source S1, an active A1, and a drain D1 of the first transistor T1 may be provided from a semiconductor pattern, and a source S2, an active A2, and a drain D2 of the second transistor T2 may be provided from a semiconductor pattern. The source S1 and the drain D1 may extend in directions opposite to each other, from the active A1 on the cross section, and the source S2 and the drain D2 may extend in directions opposite to each other, from the active A2 on the cross section. FIG. 5 illustrates a portion of a connection signal line SCL defined from the semiconductor pattern. Although not illustrated, the connection signal line SCL may be connected to the drain D2 of the second transistor T2 on a plane.

The first insulating layer 10 may be disposed on the substrate SUB. The first insulating layer 10 may commonly overlap with the plurality of pixels PX and may cover the semiconductor pattern. The first insulating layer 10 may be an inorganic layer or an organic layer, and may have a single-layer structure or a multilayer structure. The first insulating layer 10 may include at least one of aluminum oxide, titanium oxide, silicon oxide, silicon oxynitride, zirconium oxide, or hafnium oxide. In an embodiment of the inventive concept, the first insulating layer 10 may be a single layer of silicon oxide.

Gates G1 and G2 may be disposed on the first insulating layer 10. The gate G1 may be a part of the metal pattern. The gates G1 and G2 may overlap with the actives A1 and A2, respectively. In the process of doping the semiconductor pattern, the gates G1 and G2 may function as masks.

The second insulating layer 20 covering the gates G1 and G2 may be disposed on the first insulating layer 10. The second insulating layer 20 may commonly overlap with the plurality of pixels PX. The second insulating layer 20 may be an inorganic layer or an organic layer, and may have a single-layer structure or a multilayer structure. The second insulating layer 20 may be a single layer of silicon oxide, like the first insulating layer 10.

An upper electrode UE may be disposed on the second insulating layer 20. The upper electrode UE may overlap with the gate G2 of the second transistor T2. The upper electrode UE may be a portion of the metal pattern. A portion of the gate G2 and the upper electrode UE overlapped therewith may define the capacitor PX_CP (refer to FIG. 5). In another embodiment of the inventive concept, the upper electrode UE may be omitted.

The third insulating layer 30 covering the upper electrode UE is disposed on the second insulating layer 20. In an embodiment of the inventive concept, the third insulating layer 30 may be a single layer of silicon oxide. A first connection electrode CNE1 may be disposed on the third insulating layer 30. The first connection electrode CNE1 may be connected to the connection signal line SCL through a contact hole CNT-1 passing through the first to third insulating layers 10 to 30.

The fourth insulating layer 40 is disposed on the third insulating layer 30. The fourth insulating layer 40 may be a single layer of silicon oxide. The fifth insulating layer 50 is disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

The sixth insulating layer 60 covering the second connection electrode CNE2 may be disposed on the fifth insulating layer 50. The sixth insulating layer 60 may be an organic layer. The light emitting device OLED may be disposed on the sixth insulating layer 60. A first electrode AE of the light emitting device OLED is connected to the second connection electrode CNE2 through a contact hole CNT-3 passing through the sixth insulating layer 60. A plurality of pixel openings OP may be defined in the pixel defining layer PDL. The pixel openings OP of the pixel defining layer PDL exposes at least a portion of the first electrode AE.

The pixel defining layer PDL may be disposed on the device layer DDL. Specifically, the pixel defining layer PDL may be disposed on the sixth insulating layer 60. The pixel defining layer PDL may overlap with the non-pixel region NPA. The plurality of pixel openings OP overlapped with the pixel regions PA may be defined in the pixel defining layer PDL.

The light emitting devices OLED may be disposed in the pixel openings OP defined in the pixel defining layer PDL. The light emitting devices OLED may include the first electrode AE, a hole control layer HCL, a light emitting layer EML, an electron control layer ECL, and a second electrode CE.

The hole control layer HCL may be commonly disposed in the pixel region PA and the non-pixel region NPA. The hole control layer HCL may include a hole transport layer, and may further include a hole injection layer. The light emitting layer EML may be disposed on the hole control layer HCL. The light emitting layer EML may be disposed in a region corresponding to the pixel opening OP. That is, the light emitting layer EML may be formed separately from each of the pixels.

The electron control layer ECL is disposed on the light emitting layer EML. The electron control layer ECL may include an electron transport layer and may further include an electron injection layer. The hole control layer HCL and the electron control layer ECL may be commonly formed in the plurality of pixels PX by using an open mask. The second electrode CE may be disposed on the electron control layer ECL. The second electrode CE has an integral shape and may be commonly disposed in the plurality of pixels PX. The thin film encapsulation layer TFE may be disposed on the second electrode CE.

Figure 7:
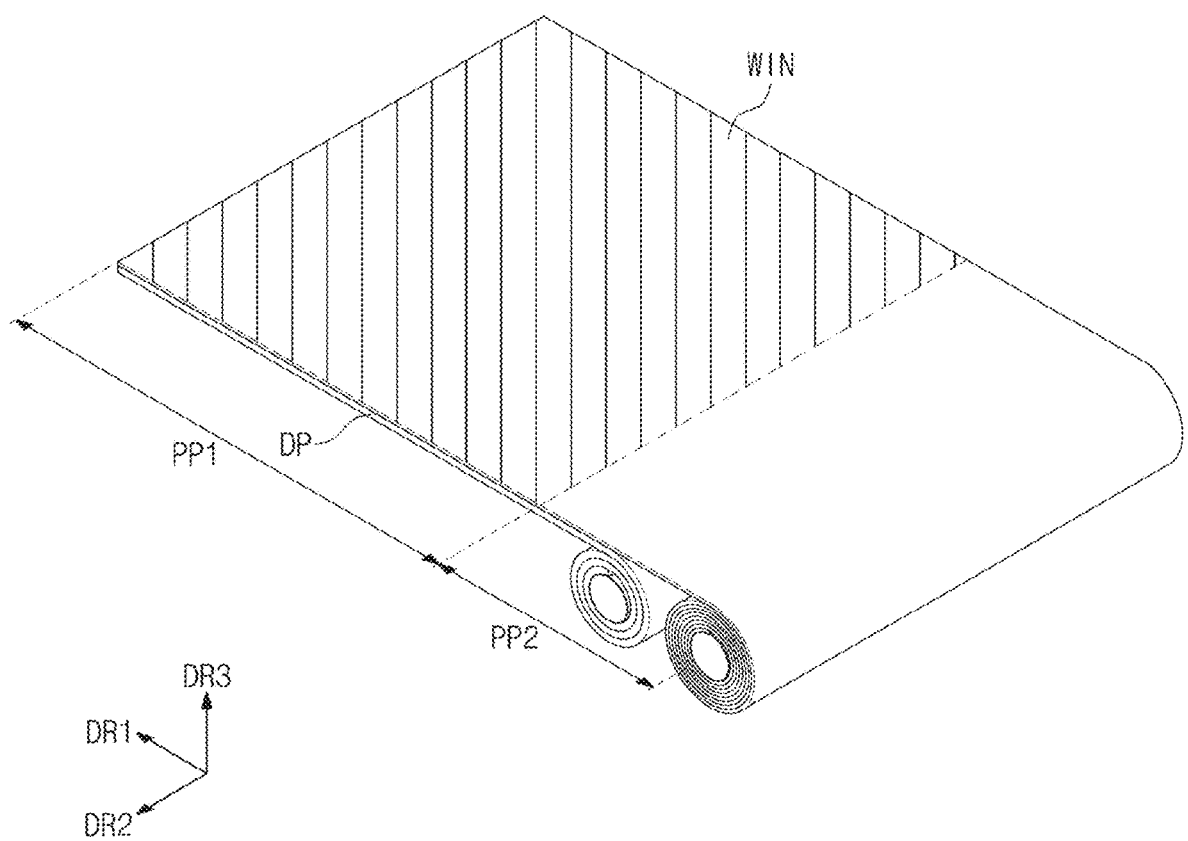
FIG. 7 is a perspective view of a display panel illustrated in FIG. 1.

FIG. 7 is a perspective view of a display panel illustrated in FIG. 1;

The display module DM may include a first part PP1 and a second part PP2 extending from the first part PP1 and having a portion rolled around the first driving part DRP1. The first part PP1 may be defined as a region exposed outside the case CS, and the second part PP2 may be defined as a region not exposed outside by the case CS. In the display module DM, the first part PP1 may be a part on which an image is displayed.

The first part PP1 may be flat. The first part PP1 may be parallel to the first direction DR1. The end of the first part PP1 may be fixed to the fastening portion CO (see FIG. 1). The end of the first part PP1 may be defined as the other end (i.e., the second end) of the display module DM.

In the first part PP1, the window WIN and the display panel DP may be coupled with each other. Although not illustrated, an adhesive (see FIG. 4) may be disposed between the window WIN and the display panel DP.

The second part PP2 may extend from the first part PP1. The end of the second part PP2 may be connected to the first driving part DRP1. The end of the second part PP2 may be defined as one end of the display module DM.

The second part PP2 may have the same width as the first part PP1 in the second direction DR2. In the second part PP2, the window WIN and the display panel DP may be separated from each other.

The boundary between the first part PP1 and the second part PP2 may be defined by the first cover CC1 of the case CS covering the first driving part DRP1.

The area of the first part PP1 and the area of the second part PP2 may be variable depending on a state. For example, when the first driving part DRP1 unrolls the second part PP2, the area of the first part PP1 may increase, and the area of the second part PP2 may decrease. Accordingly, in the display module DM, the region exposed outside the case CS may increase. That is, the display device DD may be switched from the first mode to the second mode.

When the first driving part DRP1 rolls the second part PP2, the area of the first part PP1 may decrease, and the area of the second part PP2 may increase. Accordingly, the region exposed outside the case CS may decrease. That is, the display device DD may be switched from the second mode to the first mode.

Figure 8:
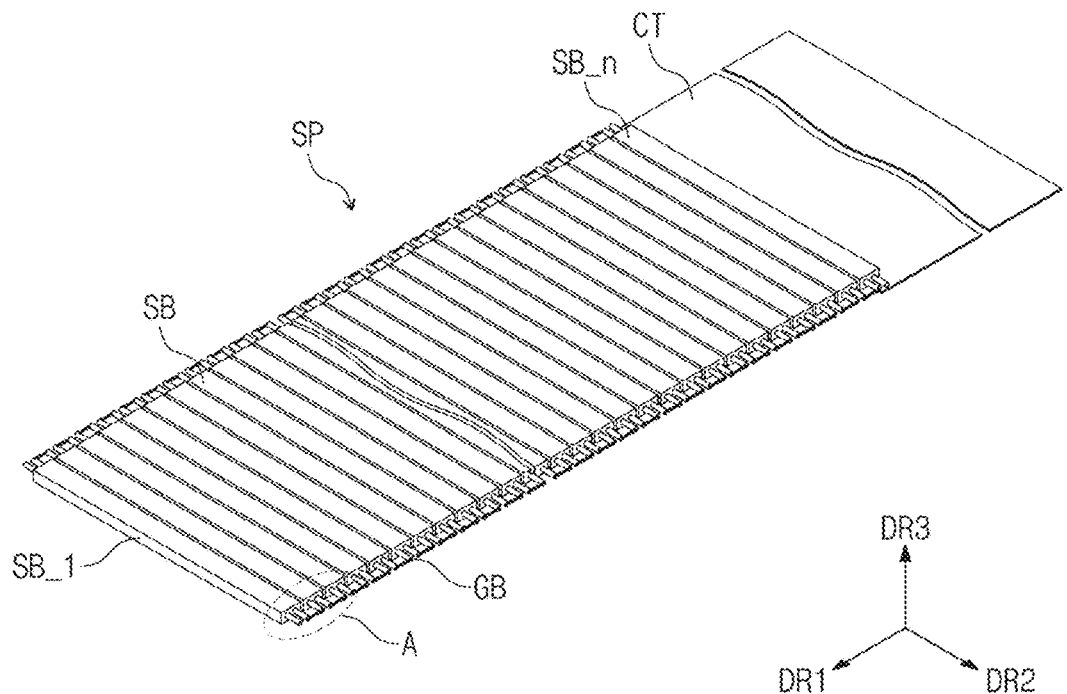
FIG. 8 is a perspective view of a supporting portion disposed under a display module illustrated in FIG. 7.

FIG. 8 is a perspective view of a supporting portion disposed under a display module illustrated in FIG. 7.

Figure 9:
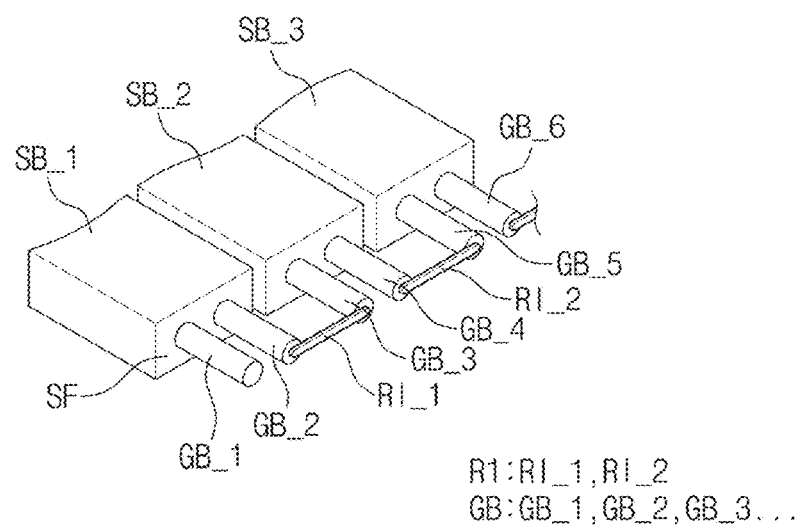
FIG. 9 is a partially enlarged view of region A illustrated in FIG. 8.

FIG. 9 is a partially enlarged view of the region A illustrated in FIG. 8.

Referring to FIG. 8, a supporting portion SP may be disposed under the display module DM. The supporting portion SP may be extended in the first direction DR1. The supporting portion SP may include a plurality of support bars SB, a plurality of guide bars GB, a plurality of links RI, and a connection sheet CT.

Each of the support bars SB may have a rod shape. Each support bar SB may be elongated in the second direction DR2. The plurality of support bars SB may be arranged in the first direction DR1. For example, n support bars SB may be sequentially arranged along the first direction DR1. The support bars SB may include n support bars SB_1 to SB n arranged in the first direction DR1. Here, n may be a natural number. The support bars SB adjacent to each other may be spaced apart by a predetermined distance in the first direction DR1.

The first support bar SB_1 may define the other end (e.g., the second end) of the supporting portion SP. The other end of the supporting portion SP may overlap with the other end of the display module DM. The other end of the supporting portion SP may be fixed to the fastening portion CO together with the other end of the display module DM, which will be described later.

Referring to FIG. 9, the guide bars GB may protrude from sides SF of the support bars SB. For example, a first guide bar GB_1 and a second guide bar GB_2 may be disposed on the side SF of the first support bar SB_1. A third guide bar GB_3 and a fourth guide bar GB_4 may be disposed on the side SF of the second support bar SB_2. A fifth guide bar GB_5 and a sixth guide bar GB_6 may be disposed on the side SF of the third support bar SB_3.

The first to sixth guide bars GB_1 to GB_6 may protrude from the sides SF of the support bars SB in the second direction DR2. The first to sixth guide bars GB_1 to GB_6 may have a circular shape. The guide bars GB may be disposed in the same structure on the opposite side of each support bar SB.

The plurality of links RI may connect the adjacent guide bars GB to each other. For example, a first link RI_1 may connect the second guide bar GB_2 and the third guide bar GB_3. A second link RI 2 may connect the fourth guide bar GB_4 and the fifth guide bar GB_5. Likewise, the plurality of links RI may be disposed on the opposite side of the support bars SB.

As a result, the plurality of support bars SB may be connected to each other by the plurality of links RI.

The connection sheet CT may be connected to the support bar SB disposed last among the support bars SB. For example, the connection sheet CT may be connected to the n-th support bar SB n.

The connection sheet CT may be a flexible sheet. One end of the connection sheet CT may be connected to the first driving part DRP1. The connection sheet CT may be rolled or unrolled by the first driving part DRP1.

Figure 10:
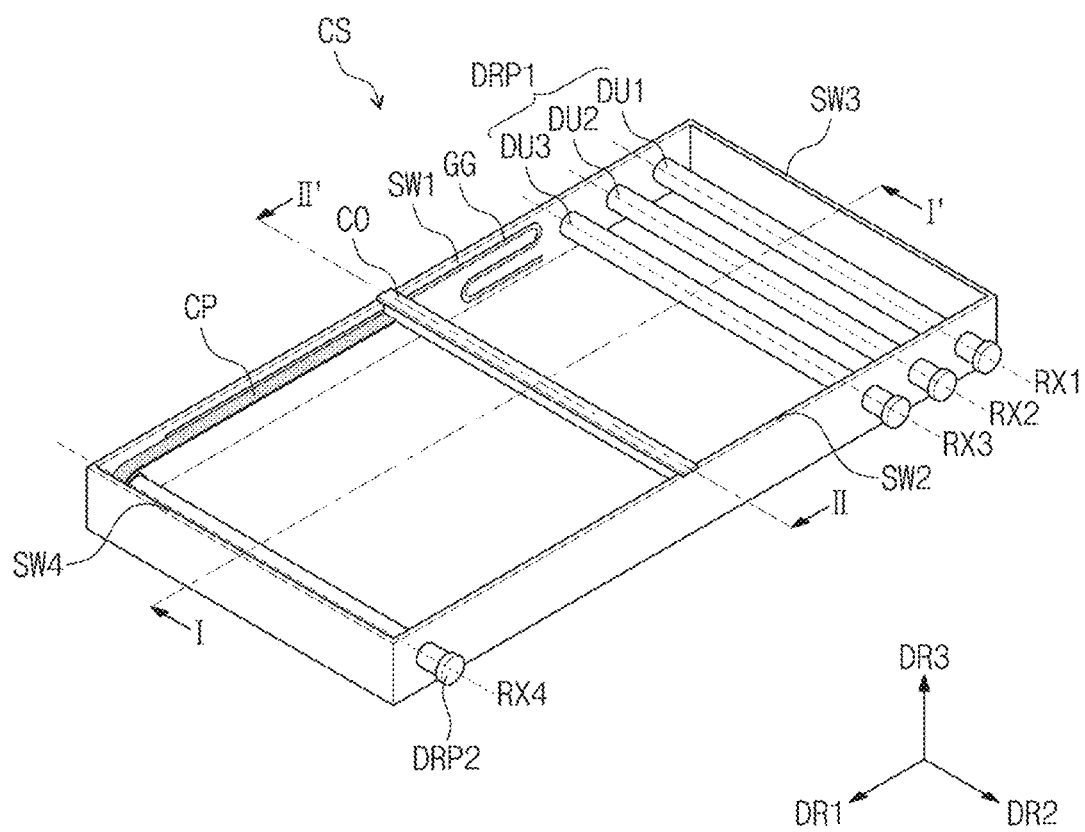
FIG. 10 is a perspective view illustrating a first driving part, a second driving part, a fastening portion, and a connecting portion mounted in a case illustrated in FIG. 1.
Figure 11:
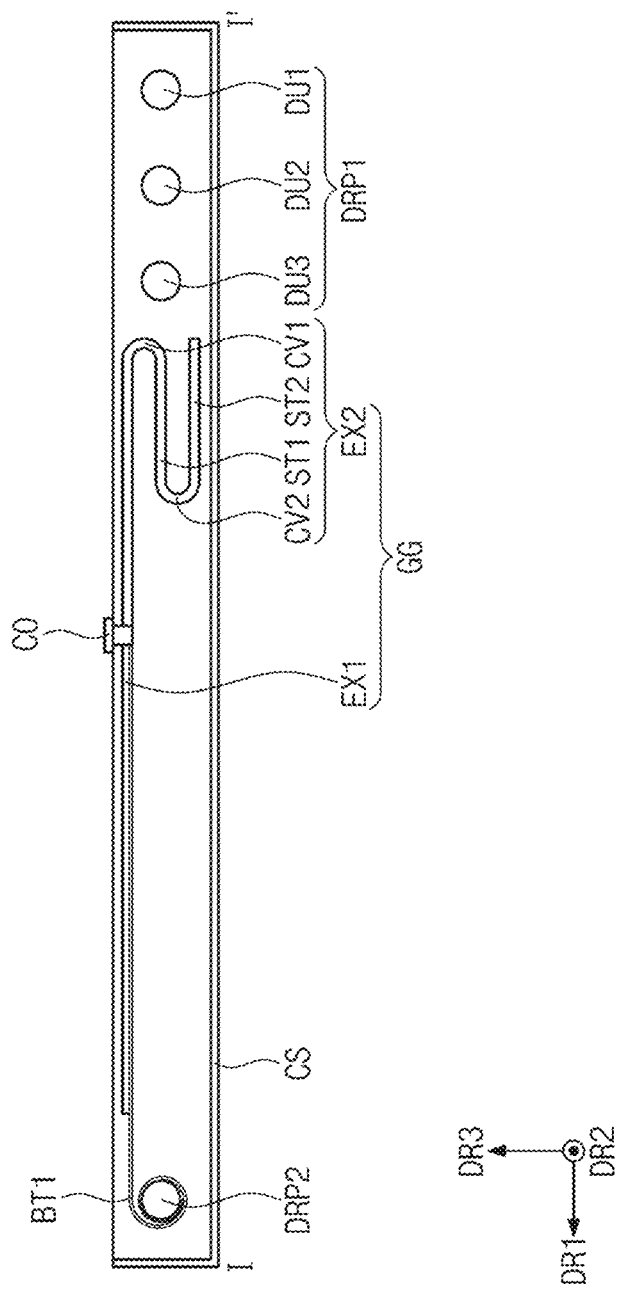
FIG. 11 is a cross-sectional view taken along line I-I' illustrated in FIG. 10.
Figure 12:
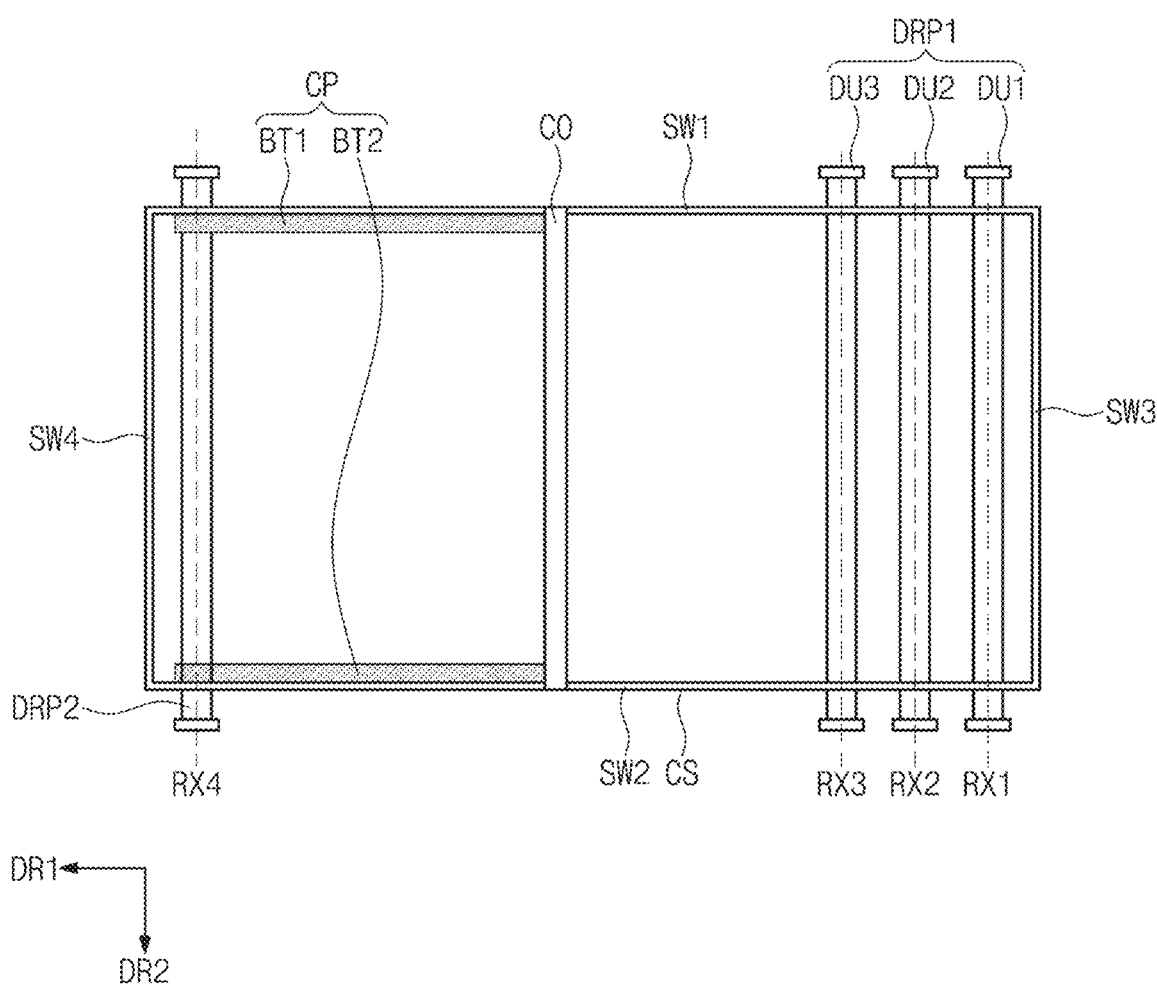
FIG. 12 is a plan view of FIG. 10 viewed from above.
Figure 13:
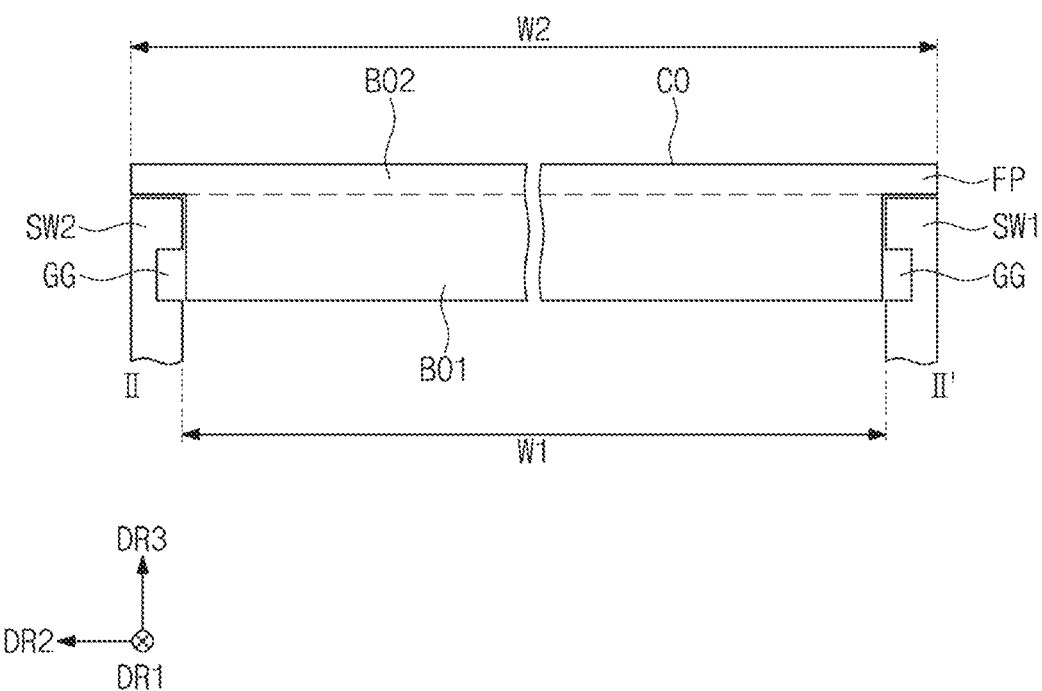
FIG. 13 is a cross-sectional view taken along line II-II' illustrated in FIG. 10.

FIG. 10 is a perspective view illustrating a first driving part, a second driving part, a fastening portion, and a connecting portion mounted in the case illustrated in FIG. 1. FIG. 11 is a cross-sectional view taken along line I-I' illustrated in FIG. 10. FIG. 12 is a plan view of FIG. 10 viewed from above. FIG. 13 is a cross-sectional view taken along line II-IP illustrated in FIG. 10.

For convenience of description, the illustration of the first cover CC1 and the second cover CC2 covering the first driving part DRP1 and the second driving part DRP2 is omitted in FIGS. 10 to 12.

Referring to FIGS. 10 to 13, the case CS may have a rectangular frame shape elongated in the first direction DR1. The case CS may include a first sidewall SW1, a second sidewall SW2, a third sidewall SW3, and a fourth sidewall SW4.

The first sidewall SW1 and the second sidewall SW2 may extend in the first direction DR1. The first sidewall SW1 and the second sidewall SW2 may face each other in the second direction DR2. The display module DM may be disposed between the first sidewall SW1 and the second sidewall SW2 and move in the first direction DR1.

The third sidewall SW3 and the fourth sidewall SW4 may extend in the second direction DR2. The third sidewall SW3 and the fourth sidewall SW4 may face each other in the first direction DR1. The third sidewall SW3 may be disposed between one end of the first sidewall SW1 and one end of the second sidewall SW2. The fourth sidewall SW4 may be disposed between the other end of the first sidewall SW1 and the other end of the second sidewall SW2.

Referring to FIG. 11, a guide groove GG may be defined on an inner surface of the first sidewall SW1. The guide groove GG may include a first extension part EX1 and a second extension part EX2. The first extension part EX1 may extend in the first direction DR1. One end of the first extension part EX1 may be defined as a part adjacent to the first driving part DRP1. The other end of the first extension part EX1 may be defined as a part adjacent to the second driving part DRP2.

The second extension part EX2 may extend from the one end (e.g., first end) of the first extension part EX1. The second extension part EX2 may include at least one straight section and at least one curved section. For example, the second extension part EX2 may include a first curve section CV1 that bends clockwise from the one end of the first extension part EX1, a first straight section ST1 that extends in the first direction DR1 from the first curved section CV1, a second curved section CV2 that bends counterclockwise from the first straight section ST1, and a second straight section ST2 that extends from the second curved section CV2 in the first direction DR1.

The guide groove GG may be defined in the same manner on the inner surface of the second sidewall SW2. The supporting portion SP may move on a path defined by the guide groove GG.

Referring to FIG. 12, the first driving part DRP1 may be disposed inside the case CS. For example, the first driving part DRP1 may be disposed to be adjacent to the inner surface of the third sidewall SW3. The first driving part DRP1 may be rotatably coupled to the first sidewall SW1 and the second sidewall SW2. Both ends of the first driving part DRP1 may protrude to the outside passing through the first sidewall SW1 and the second sidewall SW2. Although not illustrated, a plurality of gears may be connected to both ends of the first driving part DPR1.

Specifically, the first driving part DRP1 may include a first driving unit DU1, a second driving unit DU2, and a third driving unit DU3. The first, second, and third driving units DU1, DU2, and DU3 may have a cylindrical shape extending in the second direction DR2. The first, second, and third driving units DU1, DU2, and DU3 may be rotatably coupled to the first sidewall SW1 and the second sidewall SW2.

The first, second, and third driving units DU1, DU2, and DU3 may rotate about rotation axes RX1, RX2, and RX3 parallel to the second direction DR2, respectively. For example, the first driving unit DU1 may rotate about the first rotation axis RX1 parallel to the second direction DR2. The second driving unit DU2 may rotate about the second rotation axis RX2 parallel to the second direction DR2. The third driving unit DU3 may rotate about the third rotation axis RX3 parallel to the second direction DR2.

The first, second, and third driving units DU1, DU2, and DU3 may rotate in the same direction. For example, the first, second, and third driving units DU1, DU2, and DU3 may rotate clockwise together. Further, the first, second, and third driving units DU1, DU2, and DU3 may rotate counterclockwise together.

The first, second, and third driving units DU1, DU2, and DU3 may be disposed to be spaced apart from each other in the first direction DR1. The second driving unit DU2 may be disposed between the first driving unit DU1 and the third driving unit DU3. The third driving unit DU3 may be disposed closer to the second driving part DRP2 than the first and second driving units DU1 and DU2.

The second driving part DRP2 may be disposed inside the case CS. The second driving part DRP2 may be disposed to be spaced apart from the first driving part DRP1 in the first direction DR1. For example, the second driving part DRP2 may be disposed to be adjacent to the inner surface of the fourth sidewall SW4.

Both ends of the second driving part DRP2 may protrude to the outside passing through the first sidewall SW1 and the second sidewall SW2. Although not illustrated, a plurality of gears may be connected to both ends of the second driving part DRP2.

The second driving part DRP2 may have a cylindrical shape extending in the second direction DR2. The second driving part DRP2 may rotate about the fourth rotation axis RX4 parallel to the second direction DR2.

The second driving part DRP2 may rotate in the same direction as the first, second, and third driving units DU1, DU2, and DU3 of the first driving part DRP1. For example, when the first, second, and third driving units DU1, DU2, and DU3 rotate clockwise, the second driving part DRP2 may also rotate clockwise. Conversely, when the first, second, and third driving units DU1, DU2, and DU3 rotate counterclockwise, the second driving part DRP2 may also rotate counterclockwise.

The first driving part DRP1 may include a first motor (not illustrated). The second driving part DRP2 may include a second motor (not illustrated). The first motor and the second motor may operate independently of each other. For example, the first motor may rotate the first driving part DRP1 clockwise or counterclockwise. The second motor may rotate the second driving part DRP2 clockwise or counterclockwise.

Referring to FIG. 13, the fastening portion CO may be disposed between the first sidewall SW1 and the second sidewall SW2. The fastening portion CO may be disposed between the first sidewall SW1 and the second sidewall SW2 and move in the first direction DR1. For example, the fastening portion CO may include a first body BO1 and a second body BO2 disposed on the first body BO1.

In the second direction DR2, a width W2 of the second body BO2 may be greater than a width W1 of the first body BO1. For example, the second body BO2 may include wings FP protruding in the second direction DR2 at both sides.

The width W1 of the first body BO1 in the second direction DR2 may correspond to the distance between the inner surface of the first sidewall SW1 and the inner surface of the second sidewall SW2. The width W2 of the second body BO2 in the second direction DR2 may correspond to the distance between the outer surface of the first sidewall SW1 and the outer surface of the second sidewall SW2. Accordingly, the lower surfaces of both wings FP of the second body BO2 may contact the upper surfaces of the first sidewall SW1 and the second sidewall SW2. As a result, the fastening portion CO may move along the extension direction of the first sidewall SW1 and the second sidewall SW2 (that is, the first direction DR1).

Referring back to FIG. 12, the connecting portion CP may be disposed between the second driving part DRP2 and the fastening portion CO. One end (e.g., first end) of the connecting portion CP may be defined as a portion adjacent to the fastening portion CO. The other end (e.g., second end) of the connecting portion CP may be defined as a portion adjacent to the second driving part DRP2. One end of the connecting portion CP may be fixed to the fastening portion CO. The other end of the connecting portion CP may be connected to the second driving part DRP2.

The connecting portion CP may include a first belt BT1 and a second belt BT2. The first belt BT1 and the second belt BT2 may extend in the first direction DR1. The first belt BT1 and the second belt BT2 may be spaced apart from each other in the second direction DR2. For example, the first belt BT1 may be disposed adjacent to the inner surface of the first sidewall SW1, and the second belt BT2 may be disposed adjacent to the inner surface of the second sidewall SW2.

One end (e.g., first end) of each of the first belt BT1 and the second belt BT2 may be connected to the fastening portion CO. The other end (e.g., second end) of each of the first belt BT1 and the second belt BT2 may be connected to the second driving part DRP2. A portion of the first belt BT1 and the second belt BT2 may be rolled counterclockwise around the second driving part DRP2 when viewed in the direction opposite to the second direction DR2 (i.e., view of FIG. 11). The first belt BT1 and the second belt BT2 may be rolled and unrolled by the second driving part DRP2.

One end of each of the first belt BT1 and the second belt BT2 may be disposed at the same position in the first direction DR1. For example, when the second driving part DRP2 rolls or unrolls the first and second belts BT1 and BT2, the ends (i.e., the first end) of the first belt BT1 and the second belt BT2 may move by the same distance in the first direction DR1. Accordingly, the fastening portion CO may move in the first direction DR1 while maintaining the state parallel to the second direction DR2.

The first belt BT1 and the second belt BT2 may include a material having a predetermined elastic force. For example, the belts BT1 and BT2 may include rubber. However, the shapes and materials of the belts BT1 and BT2 of the inventive concept are not limited thereto. The belts BT1 and BT2 may be implemented with a chain structure in which a plurality of gears is connected to each other in another embodiment.

Figure 14:
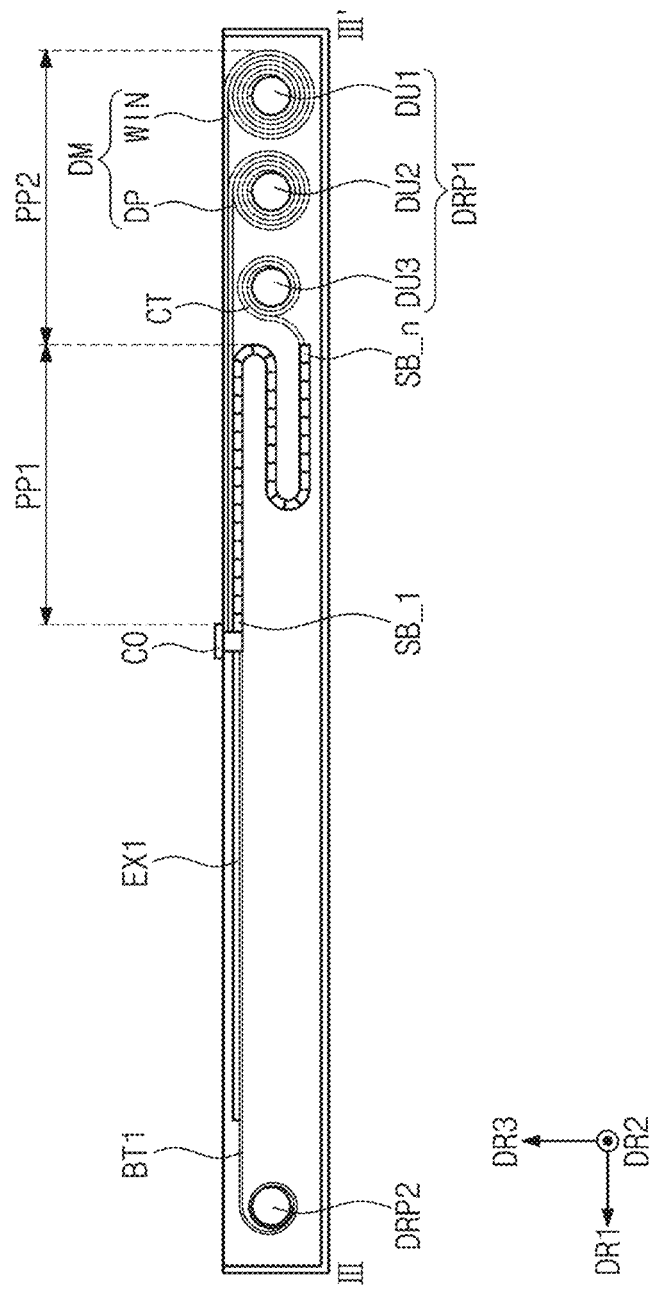
FIG. 14 is a cross-sectional view taken along line illustrated in FIG. 1.
Figure 15:
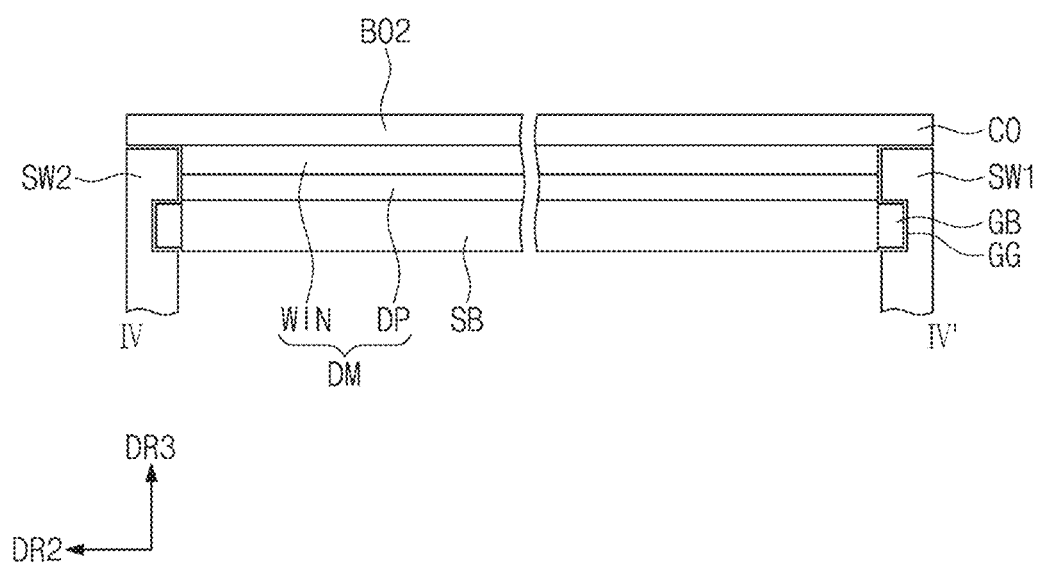
FIG. 15 is a cross-sectional view taken along line IV-IV' illustrated in FIG. 1.

FIG. 14 is a cross-sectional view taken along line illustrated in FIG. 1. FIG. 15 is a cross-sectional view taken along line IV-IV' illustrated in FIG. 1.

Referring to FIGS. 14 and 15, one end (e.g., first end) of the display module DM may be connected to the first driving part DRP1. Specifically, one end (e.g., first end) of the window WIN may be connected to the first driving unit DU1'. A portion of the window WIN may be rolled clockwise around the first driving unit DU1. The first driving unit DU1 may roll and unroll the window WIN. One end (e.g., first end) of the display panel DP may be connected to the second driving unit DU2. A portion of the display panel DP may be rolled clockwise around the second driving unit DU2. The second driving unit DU2 may roll and unroll the display panel DP. One end (e.g., first end) of the connection sheet CT of the supporting portion SP may be connected to the third driving unit DU3. The connection sheet CT may be rolled clockwise around the third driving unit DU3. The third driving unit DU3 may roll and unroll the connection sheet CT of the supporting portion SP.

The other end (e.g., second end) of the display module DM (that is, the other end of each of the window WIN and the display panel DP) may be fixed to the fastening portion CO. The first support bar SB_1 of the supporting portion SP may be fixed to the fastening portion CO. Therefore, the other end (e.g., second end) of the display module DM and the other end (e.g., second end) of the supporting portion SP may be integrally moved.

The first part PP1 of the display module DM may be supported by the supporting portion SP. In the second part PP2 of the display module DM, the display panel DP and the supporting portion SP may be separated.

The guide bars GB of the supporting portion SP may be inserted into the guide grooves GG defined in the first sidewall SW1 and the second sidewall SW2. The supporting portions SP may move in a path defined by the first extension part EX1 and the second extension part EX2 of the guide grooves GG. When viewed in the direction opposite to the second direction DR2, a portion of the supporting portion SP supporting the first part PP1 of the display module DM may be disposed on the first extension part EX1. The rest of the supporting portion SP may be disposed on the second extension part EX2.

Figure 16:
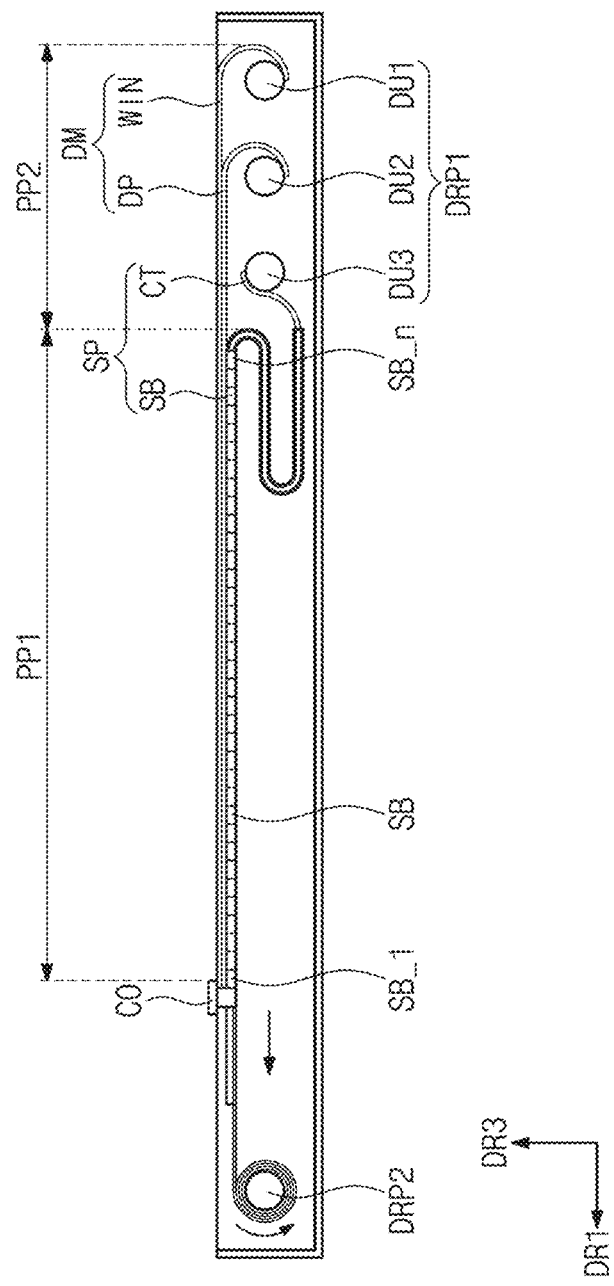
FIG. 16 is a diagram illustrating a state in which an exposed region of the display module of the display device according to an embodiment of the inventive concept is expanded.
Figure 17:
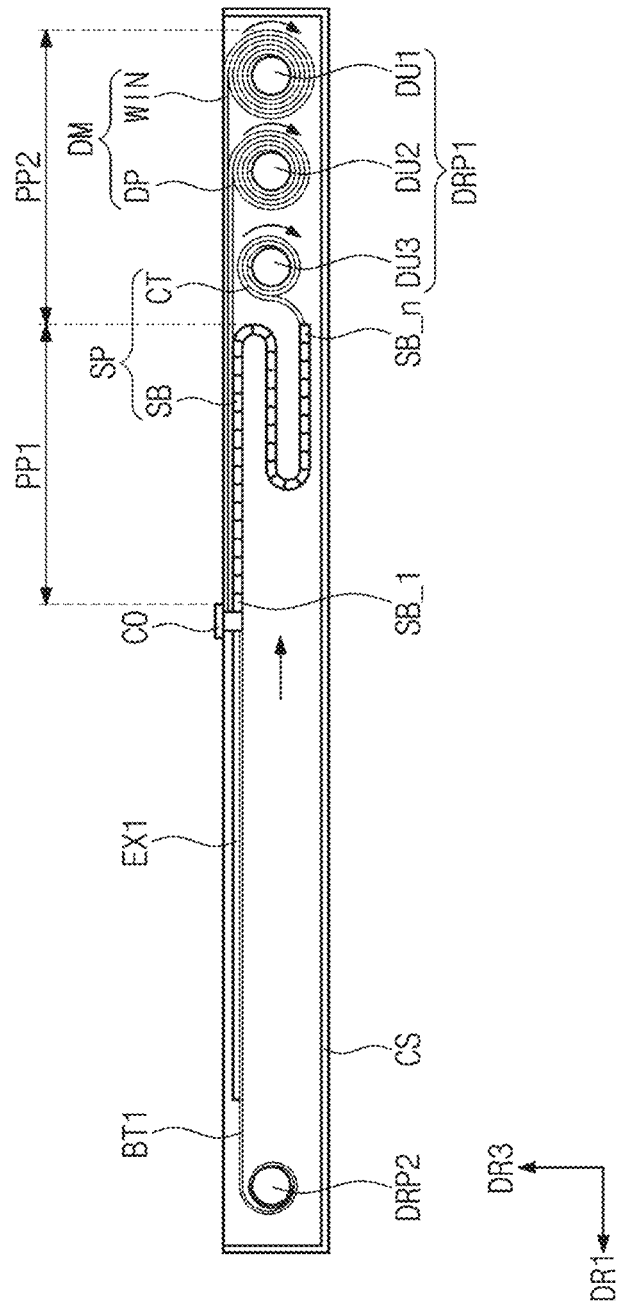
FIG. 17 is a diagram illustrating a state in which the exposed region of the display module of the display device according to an embodiment of the inventive concept is reduced.

FIG. 16 is a diagram illustrating a state in which an exposed region of the display module of the display device according to an embodiment of the inventive concept is expanded. FIG. 17 is a diagram illustrating a state in which the exposed region of the display module of the display device according to an embodiment of the inventive concept is reduced.

Referring to FIG. 16, the first part PP1 of the display device DD may be expanded by the second driving part DRP2. For example, the second driving part DRP2 may rotate counterclockwise by the second motor. The other end (i.e., second end) of each of the first belt BT1 and the second belt BT2 of the connecting portion CP may be rolled around the second driving part DRP2. The fastening portion CO connected to the one end (i.e., the first end) of each of the first belt BT1 and the second belt BT2 may move to approach the second driving part DRP2.

At this time, the connection sheet CT of the display module DM and the supporting portion SP may be unrolled from the first driving part DRP1. The first driving part DRP1 may rotate counterclockwise by the force by which the fastening portion CO pulls the display module DM and the supporting portion SP. That is, a separate rotational force may not be applied to the first driving part DRP1.

Specifically, as the other end (i.e., the second end) of the window WIN moves toward the second driving part DRP2 by the fastening portion CO, one end (i.e., the first end) of the window WIN may be unrolled from the first driving unit DU1. As the other end of the display module DM moves toward the second driving part DRP2 by the fastening portion CO, one end (i.e., the first end) of the display panel DP may be unrolled from the second driving unit DU2.

As the first support bar SB_1 moves toward the second driving part DRP2 by the fastening portion CO, the support bars SB may move on the path defined by the first extension part EX1 and the second extension part EX2. The connection sheet CT may be unrolled from the third driving unit DU3 by the movement of the n-th support bar SB n, and move to the second extension part EX2.

Referring to FIG. 17, the first part PP1 of the display device DD may be reduced by the first driving part DRP1. For example, the first driving part DRP1 may rotate clockwise by the first motor.

Specifically, as the first driving unit DU1 rotates clockwise, one end (i.e., the first end) of the window WIN may be rolled around the first driving unit DU1. As the second driving unit DU2 rotates clockwise, one end (i.e., the first end) of the display panel DP may be rolled around the second driving unit DU2. As the third driving unit DU3 rotates clockwise, the connection sheet CT of the supporting portion SP may be rolled around the third driving unit DU3. As the connection sheet CT is rolled, the support bars SB may move toward the second extension part EX2.

The fastening portion CO may move toward the first driving part DRP1 as one end (i.e., the first end) of the display module DM and the connection sheet CT of the supporting portion SP are rolled around the first driving part DRP1. At this time, the first belt BT1 and the second belt BT2 may be unrolled from the second driving part DRP2.

The second driving part DRP2 may rotate clockwise by the force by which the fastening portion CO pulls the belts BT1 and BT2.

According to an embodiment of the inventive concept, when the display module DM is expanded, the second driving part DRP2 simultaneously pulls the other end of the display module DM and the other end of the supporting portion SP, and thus the rolled display module DM and the supporting portion may be stably unfolded.

In addition, according to an embodiment of the inventive concept, when the display module DM is reduced, the second driving part DRP2 stably fixes the other end of the display module DM and the other end of the supporting portion SP, and thus the display module DM and the supporting portion SP may be stably rolled on the first driving part DRP1.

As described above, the display device according to an embodiment of the inventive concept is provided with a plurality of driving parts DRP1 and DRP2 spaced apart from each other in the moving direction of the display module DM, which makes the display module DM possible to be more stably expanded and reduced.

Figure 18:
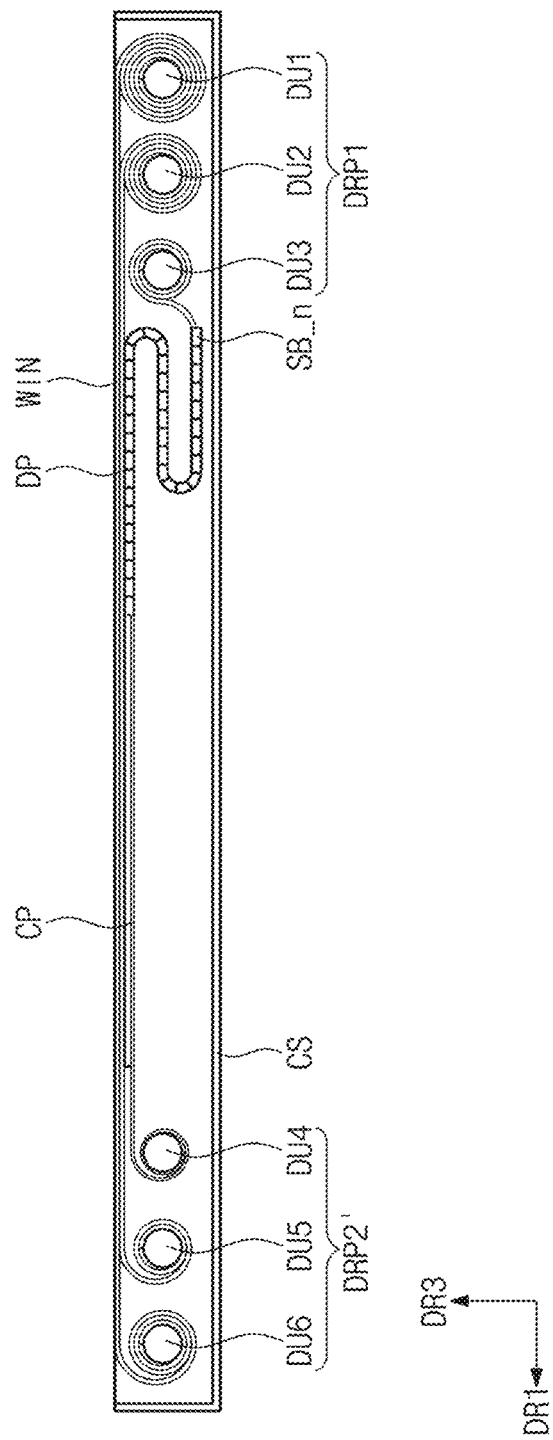
FIG. 18 is a diagram illustrating a display device according to a modified example of the inventive concept.

FIG. 18 is a diagram illustrating a display device according to a modified example of the inventive concept.

The display device according to the modified example has a difference from the above-described embodiment in the structure of the second driving part. In the following description, the description of the same configuration as the above-described embodiment will be omitted, and a description will be given focusing on the configuration having a difference.

Referring to FIG. 18, a second driving part DRP2' may include a fourth driving unit DU4, a fifth driving unit DU5, and a sixth driving unit DU6.

The fourth, fifth, and sixth driving units DU4, DU5, and DU6 may be spaced apart in the first direction DR1. The fifth driving unit DU5 may be disposed between the fourth driving unit DU4 and the sixth driving unit DU6.

The fourth driving unit DU4 may be disposed closest to the first driving part DRP1.

One end (i.e., the first end) of the connecting portion CP may be connected to the supporting portion SP, and the other end (i.e., the second end) of the connecting portion CP may be connected to the fourth driving unit DU4. A portion of the connecting portion CP may be rolled counterclockwise around the fourth driving unit DU4 during the expanding state. The fourth driving unit DU4 may roll and unroll the connecting portion CP.

The other end (i.e., the second end) of the display panel DP may be connected to the fifth driving unit DU5. A portion of the display panel DP may be rolled counterclockwise around the fifth driving unit DU5 during the expanding state. The fifth driving unit DU5 may roll and unroll the display panel DP.

The other end of the window WIN may be connected to the sixth driving unit DU6. A portion of the window WIN may be rolled counterclockwise around the sixth driving unit DU6. The sixth driving unit DU6 may roll and unroll the window WIN.

According to the modified example, the second driving part DRP2' may include three driving units DU4, DU5, and DU6 for rolling and unrolling the window WIN, the display panel DP, and the connecting portion CP, respectively. Accordingly, when the display module DM is expanded and reduced, the rolling and unrolling operations of the window WIN, the display panel DP, and the support portions SP may be more precisely and stably performed.

According to an embodiment of the inventive concept, when the first driving part rolls the display module, the second driving part unrolls the connecting portion. As a result, it is possible to reduce the exposed region of the display module. When the first driving part unrolls the display module, the second driving part rolls the connecting portion. As a result, it is possible to expand the exposed region of the display module. As described above, the display device includes first and second driving parts disposed at both ends of the display module, and reduction and expansion of the display module are controlled by the first driving part and the second driving part, respectively. Therefore, expansion and reduction of the display module may be made more stable without damaging the display module.

Although the embodiments have been described, it is understood that one ordinary skilled in the art can make various changes and modifications to the present invention without departing from the spirit and scope of the present invention as hereinafter claimed. In addition, the exemplary embodiments disclosed in the present invention are not intended to limit the technical idea of the present invention, and all technical ideas within the scope of the following claims and equivalents thereof should be construed as being included in the scope of the present invention.

What is claimed is:

1. A display device comprising:
    a display module extending in a first direction;
    a supporting portion disposed under the display module and which supports a part of the display module;
    a first driving part connected to a first end of the display module to roll and unroll the display module;
    a connecting portion connected to a second end of the display module; and
    a second driving part connected to the connecting portion to roll and unroll the connecting portion,
    wherein the second driving part unrolls the connecting portion when the first driving part rolls the display module, and the second driving part rolls the connecting portion when the first driving part unrolls the display module, and
    wherein the first driving part and the second driving part maintain a constant distance therebetween while unrolling and rolling the display module and the connecting portion.

2. The display device of claim 1, wherein
    the second end of the display module moves away from the second driving part along the first direction when the first driving part rolls the display module, and
    the second end of the display module moves toward the second driving part along the first direction when the first driving part unrolls the display module.

3. The display device of claim 2, wherein
    each of the first driving part and the second driving part rotates about a rotation axis parallel to a second direction crossing the first direction, and
    the first driving part and the second driving part rotate in a same direction.

4. The display device of claim 1, wherein
    the display module includes:
    a first part exposed outside; and
    a second part extending from the first part, not exposed outside, and having a portion rolled around the first driving part, and
    wherein the supporting portion is disposed under the first part to support the first part and is separated from the second part.

5. The display device of claim 4, wherein
the display module includes:
  a window; and
  a display panel disposed under the window, and
wherein the window and the display panel are separated from each other in the second part.

6. The display device of claim 5, wherein
the first driving part includes:
  a first driving unit connected to a first end of the window to roll and unroll the window;
  a second driving unit connected to a first end of the display panel to roll and unroll the display panel; and
  a third driving unit connected to a first end of the supporting portion to roll and unroll the supporting portion.

7. The display device of claim 6, wherein
the first driving unit, the second driving unit, and the third driving unit are spaced apart from each other,
the second driving unit is disposed between the first driving unit and the third driving unit, and
the third driving unit is closer to the second driving part than the first and second driving units.

8. The display device of claim 1, further comprising:
a fastening portion which fixes a second end of the display module and a second end of the supporting portion,
wherein the connecting portion is connected to the display module and the supporting portion through the fastening portion.

9. The display device of claim 8, wherein
the fastening portion includes:
  a first body; and
  a second body disposed on the first body, and
wherein the second body has a greater width in a second direction crossing the first direction than the first body.

10. The display device of claim 1, wherein
the connecting portion includes:
  a first belt extending in the first direction; and
  a second belt extending in the first direction and spaced apart from the first belt in a second direction crossing the first direction.

11. The display device of claim 10, wherein
a first end of the first belt and a first end of the second belt are disposed at a same position in the first direction.

12. The display device of claim 1, wherein
the connecting portion contains a material having a predetermined elastic force.

13. The display device of claim 1, wherein
the supporting portion includes:
  a plurality of support bars arranged in the first direction;
  a plurality of guide bars protruding from both sides of each of the plurality of support bars in a second direction crossing the first direction; and
  a plurality of links connecting the plurality of guide bars.

14. The display device of claim 13, further comprising:
a case including a first sidewall and a second sidewall which extend in the first direction and face each other in a second direction crossing the first direction,
wherein the display module is disposed between the first sidewall and the second sidewall and moves in the first direction.

15. The display device of claim 14, wherein
the guide bars are inserted into guide grooves defined in the first sidewall and the second sidewall of the case.

16. The display device of claim 15, wherein
the guide groove includes:
  a first extension part extending in the first direction; and
  a second extension part extending from the first extension part and disposed under the first extension part.

17. The display device of claim 14, wherein
the first driving part and the second driving part are rotatably coupled to the first sidewall and the second sidewall.

18. A display device comprising:
a display module;
a supporting portion disposed under the display module and which supports a part of the display module;
a first driving part connected to a first end of the display module to roll and unroll the display module; and
a second driving part connected to a second end of the display module to roll and unroll the display module,
wherein
the second driving part unrolls the display module when the first driving part rolls the display module,
the first driving part unrolls the display module when the second driving part rolls the display module, and
the first driving part and the second driving part maintain a constant distance therebetween while unrolling and rolling the display module.

19. The display device of claim 18, wherein
the display module includes:
  a window; and
  a display panel disposed under the window,
the first driving part includes:
  a first driving unit connected to a first end of the window to roll and unroll the window; and
  a second driving unit connected to a first end of the display panel to roll and unroll the display panel, and
the second driving part includes:
  a fourth driving unit connected to a second end of the window to roll and unroll the window; and
  a fifth driving unit connected to a second end of the display panel to roll and unroll the display panel.

20. The display device of claim 18, wherein
the first driving part further includes:
  a third driving unit connected to a first end of the supporting portion, and
the second driving part further includes:
  a sixth driving unit connected to a second end of the supporting portion.

* * * * *